(12) United States Patent
Hsieh et al.

(10) Patent No.: US 11,832,538 B2
(45) Date of Patent: Nov. 28, 2023

(54) RESISTIVE MEMORY ELEMENTS WITH AN EMBEDDED HEATING ELECTRODE

(71) Applicant: GLOBALFOUNDRIES Singapore Pte. Ltd., Singapore (SG)

(72) Inventors: Curtis Chun-I Hsieh, Singapore (SG); Juan Boon Tan, Singapore (SG); Calvin Lee, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 99 days.

(21) Appl. No.: 17/467,966

(22) Filed: Sep. 7, 2021

(65) Prior Publication Data
US 2023/0071580 A1    Mar. 9, 2023

(51) Int. Cl.
*H10N 70/00* (2023.01)

(52) U.S. Cl.
CPC ....... *H10N 70/8413* (2023.02); *H10N 70/011* (2023.02); *H10N 70/826* (2023.02); *H10N 70/8418* (2023.02)

(58) Field of Classification Search
CPC ............. H01L 45/1233; H01L 45/1253; H01L 45/126; H01L 45/1273; H01L 45/16; H10N 70/011; H10N 70/826; H10N 70/8413; H10N 70/8418
See application file for complete search history.

(56) References Cited

U.S. PATENT DOCUMENTS

| | | | |
|---|---|---|---|
| 9,362,496 B2 | 6/2016 | Walls et al. | |
| 10,003,021 B2 | 6/2018 | Walls et al. | |
| 10,903,422 B2 | 1/2021 | Leobandung | |
| 2007/0063180 A1* | 3/2007 | Asano | H01L 45/1683 257/3 |
| 2010/0012915 A1* | 1/2010 | Yoon | H01L 45/126 438/102 |

OTHER PUBLICATIONS

W. Lian et al., "Improved Resistive Switching Uniformity in $\hbox{Cu/HfO}_{2}/\hbox{Pt}$ Devices by Using Current Sweeping Mode," in IEEE Electron Device Letters, vol. 32, No. 8, pp. 1053-1055, Aug. 2011, doi: 10.1109/LED.2011.2157990.

Bakan et al., "Extracting the temperature distribution on a phase-change memory cell during crystallization", Journal of Applied Physics 120, 164504 (2016).

J. Y. Wu et al., "A low power phase change memory using thermally confined TaN/TiN bottom electrode," 2011 International Electron Devices Meeting, 2011, pp. 3.2.1-3.2.4.

* cited by examiner

*Primary Examiner* — Robert G Bachner
*Assistant Examiner* — Molly K Reida
(74) *Attorney, Agent, or Firm* — Thompson Hine LLP

(57) ABSTRACT

Structures for a resistive memory element and methods of forming a structure for a resistive memory element. A resistive memory element has a first electrode, a second electrode partially embedded in the first electrode, a third electrode, and a switching layer positioned between the first electrode and the third electrode. The second electrode includes a tip positioned in the first electrode adjacent to the switching layer and a sidewall that tapers to the tip.

20 Claims, 4 Drawing Sheets

RESISTIVE MEMORY ELEMENTS WITH AN EMBEDDED HEATING ELECTRODE

BACKGROUND

The invention relates to integrated circuits and semiconductor device fabrication and, more specifically, to structures for a resistive memory element and methods of forming a structure for a resistive memory element.

A resistive random-access memory (ReRAM or RRAM) device provides one type of embedded non-volatile memory technology. Because resistive memory elements are non-volatile, bits of data are retained as stored content by the resistive random-access memory device when the resistive memory elements are not powered. The non-volatility of a resistive random-access memory device contrasts with volatile memory technologies, such as a static random-access memory (SRAM) device in which the stored content is eventually lost when unpowered and a dynamic random-access memory (DRAM) device in which the stored content is lost unless periodically refreshed.

A resistive memory element includes a switching layer that is positioned between a bottom electrode and a top electrode. The resistive memory element can be programmed by changing the resistance across the switching layer to provide different content-storage states, namely a high-resistance state and a low-resistance state, representing the stored bits of data. The switching layer can be modified by applying a programming voltage sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the device to the high-resistance state. The content-storage state can be read by measuring a voltage drop across the resistive memory element after it is programmed.

A resistive memory element may experience excessive power consumption and exhibit switching variations, which may be heavily influenced by the switching area occupied by the filaments. Past approaches for minimizing the switching area have included reducing the size of the bottom electrode and/or thinning the switching layer. However, such approaches are limited in their ability to reduce either power consumption or switching variations.

Improved structures for a resistive memory element and methods of forming a structure for a resistive memory element are needed.

SUMMARY

According to an embodiment of the invention, a structure includes a resistive memory element having a first electrode, a second electrode partially embedded in the first electrode, a third electrode, and a switching layer positioned between the first electrode and the third electrode. The second electrode includes a tip positioned in the second electrode adjacent to the switching layer and a sidewall that tapers to the tip.

According to another embodiment of the invention, a method of forming a structure for a resistive memory element is provided. The method includes forming a first electrode including a tip and a sidewall that tapers to the tip, forming a second electrode on the first electrode, forming a switching layer on the second electrode, and forming a third electrode on the switching layer. The first electrode is partially embedded in the second electrode with the tip of the first electrode adjacent to the switching layer. The switching layer is positioned between the second electrode and the third electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
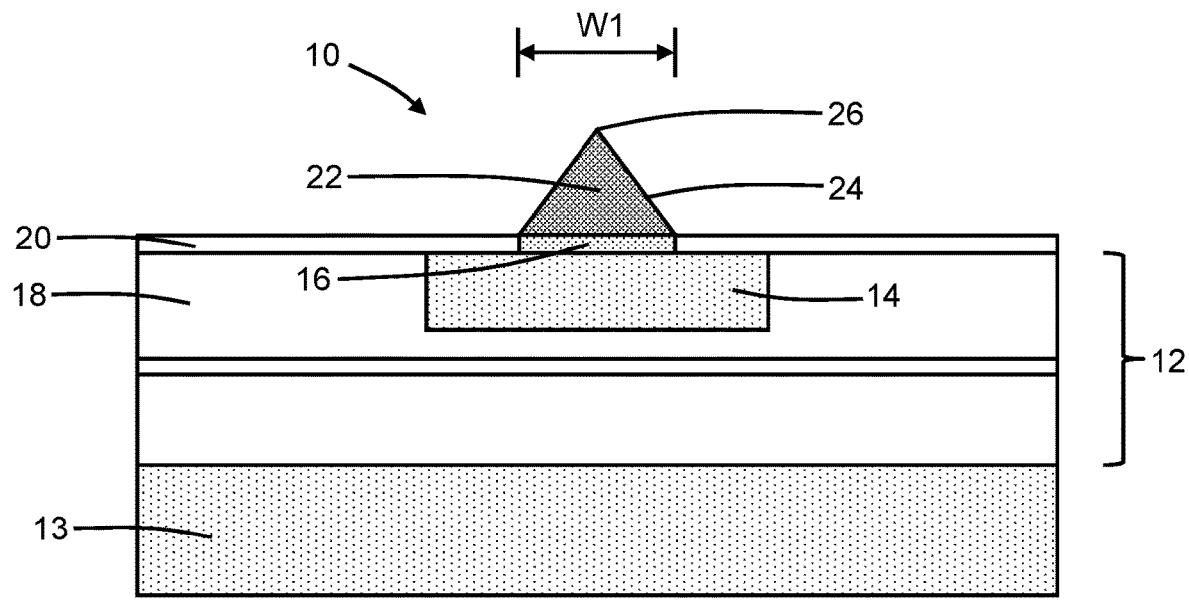
FIGS. 1-3 are diagrammatic cross-sectional views of a structure for a resistive memory element at successive fabrication stages of a processing method in accordance with embodiments of the invention.

With reference to FIG. 1 and in accordance with embodiments of the invention, a structure 10 for a resistive memory element is disposed in a metallization level of an interconnect structure 12. The interconnect structure 12 is fabricated by middle-of-line and back-end-of-line processing over a semiconductor substrate 13. The structure 10 may be positioned in a vertical direction over a metal feature 14 in one of the metallization levels, such as the Metal-2 (M2) metallization level, of the interconnect structure 12. The structure 10 may include a via 16 that is connected to the metal feature 14. The interconnect structure 12 includes an interlayer dielectric layer 18 that may be comprised of a dielectric material, such as silicon dioxide, and an intralayer dielectric layer 20 that may be comprised of a dielectric material, such as silicon dioxide. The metal feature 14 may be comprised of a metal, such as copper, and may be embedded in the interlayer dielectric layer 18. The via 16 may be comprised of a metal, such as tungsten, tantalum nitride, or titanium nitride, and may extend from the metal feature 14 to penetrate through the intralayer dielectric layer 20.

The structure 10 includes a heating electrode 22 that is positioned on and over the via 16. The heating electrode 22 projects in a vertical direction away from the via 16 and metal feature 14. The heating electrode 22 includes a tip 26 and a tapered sidewall 24 that terminates at the tip 26. The tip 26 defines an apex of the heating electrode 22 that is opposite to its base at the via 16, and the tip 26 may taper over its height to a point at the apex. In the representative embodiment, the heating electrode 22 has a width dimension w1 that narrows (i.e., decreases) with increasing distance from the via 16 and metal feature 14. In the representative embodiment, the width dimension W1 of the heating electrode 22 is largest at the interface with the via 16 and smallest at the tip 26. In the representative embodiment, the width dimensions of the heating electrode 22 and the via 16 may be equal or approximately equal at the interface between the heating electrode 22 and the via 16. In an embodiment, the heating electrode 22 may have a conical shape and the width dimension W1 may represent the diameter of the conical shape.

In an embodiment, the heating electrode 22 may be comprised of a metal, such as tantalum nitride or titanium nitride. In an embodiment, the heating electrode 22 may be comprised of a non-metal, such as silicon germanium. In an embodiment, the heating electrode 22 and the via 16 may be comprised of the same metal (e.g., tantalum nitride or titanium nitride). The heating electrode 22 may be formed by patterning a block of material with lithography and etching processes, and then using a reactive ion etching process to impart the pointed shape. For example, a reactive ion etching process using an ionized gas mixture of oxygen and argon may be used to form the pointed shape.

Figure 2:
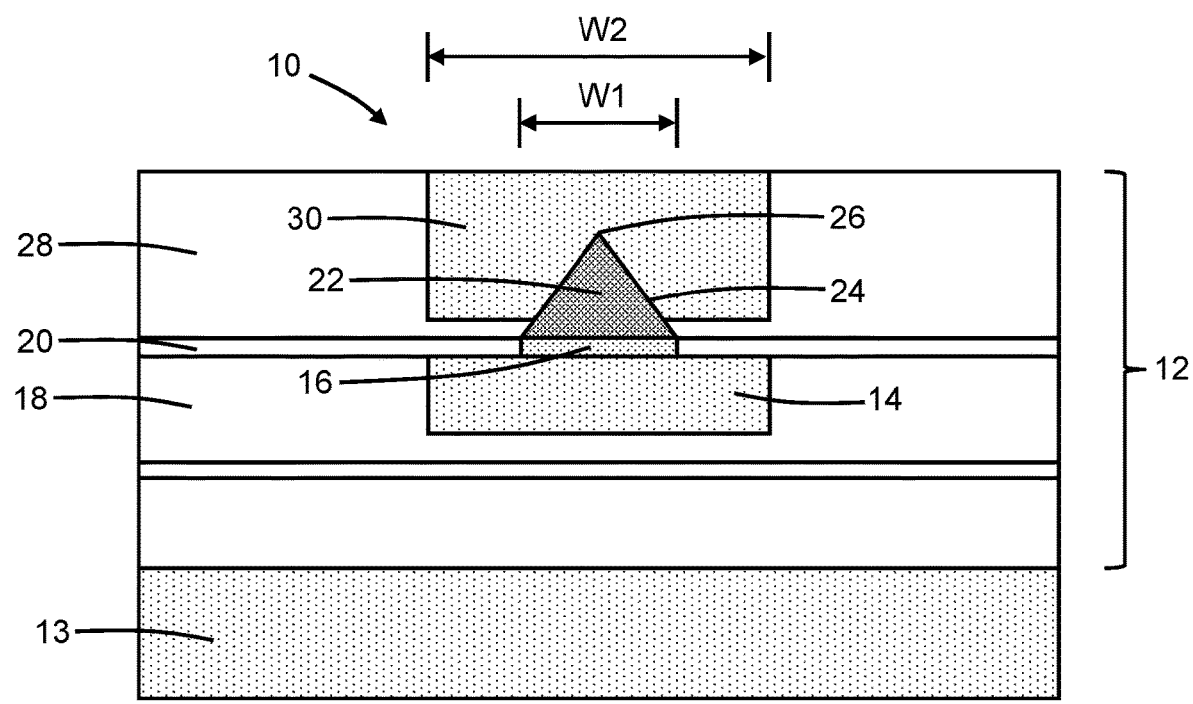

With reference to FIG. 2 in which like reference numerals refer to like features in FIG. 1 and at a subsequent fabrication stage of the processing method, an interlayer dielectric layer 28 is formed over the intralayer dielectric layer 20 and the heating electrode 22. The interlayer dielectric layer 28 may be comprised of a dielectric material, such as silicon dioxide, deposited by chemical vapor deposition.

The structure 10 includes a bottom electrode 30 that is positioned in the interlayer dielectric layer 28 to overlap with the heating electrode 22. The heating electrode 22 protrudes into, and is partially embedded in, the bottom electrode 30. In an embodiment, the heating electrode 22 and the bottom electrode 30 may be comprised of different materials. In an embodiment, the heating electrode 22 and the bottom electrode 30 may be comprised of different metals. The bottom electrode 30, which may be formed in the interlayer dielectric layer 28 by a damascene process, may be comprised of a metal, such as copper or silver. In an embodiment, the bottom electrode 30 may have a width dimension W2 that is greater than the maximum of the width dimension W1 of the heating electrode 22.

The heating electrode 22 has an upper portion that includes the tip 26 and a lower portion that is arranged in a vertical direction between the upper portion and the via 16. The upper portion of the heating electrode 22 may be in direct contact at the sidewall 24 with the bottom electrode 30, and the lower portion of the heating electrode 22 may be in direct contact at the sidewall 24 with the interlayer dielectric layer 28. The upper portion of the heating electrode 22 is embedded in the bottom electrode 30, and the lower portion of the heating electrode 22 is embedded in a portion of the interlayer dielectric layer 28 between the intralayer dielectric layer 20 and the bottom electrode 30.

Figure 3:
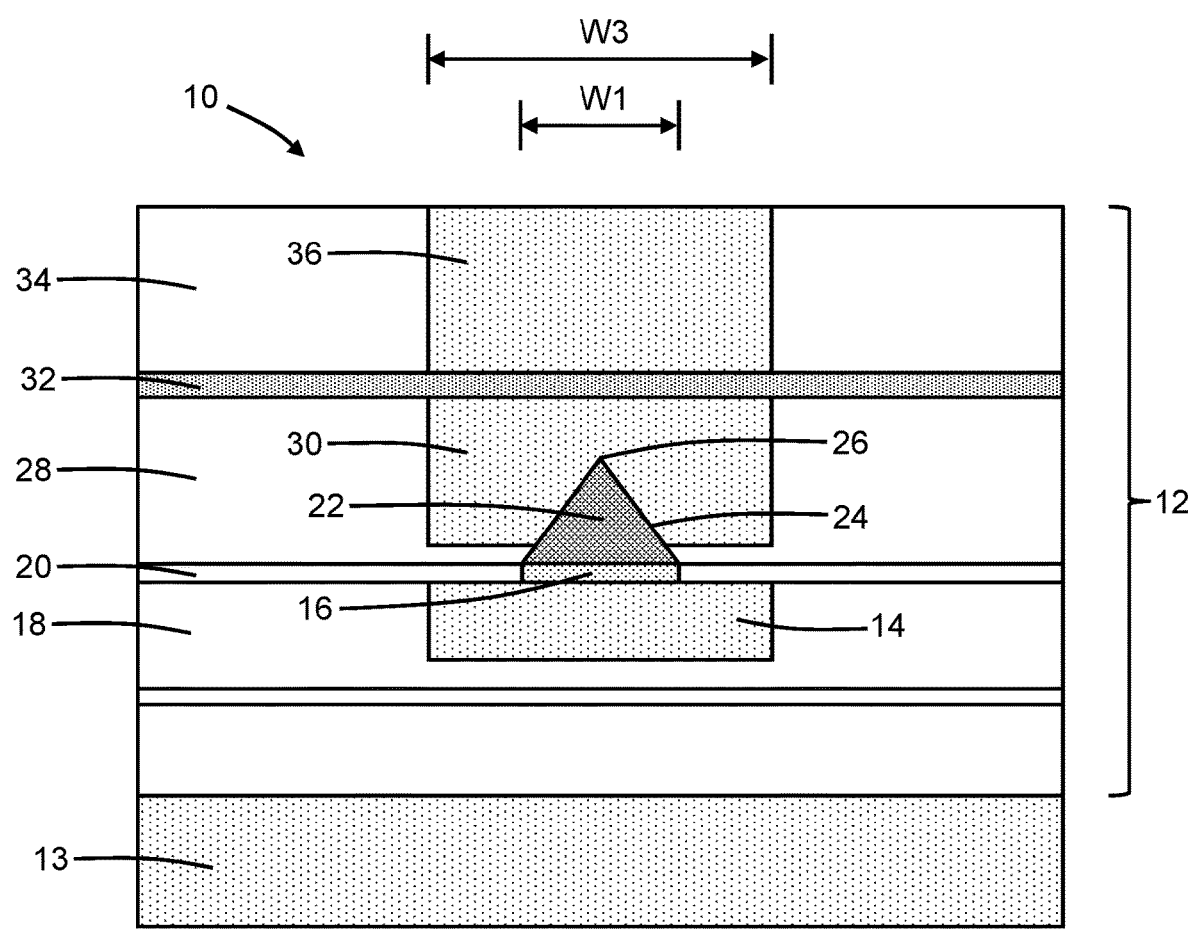

With reference to FIG. 3 in which like reference numerals refer to like features in FIG. 2 and at a subsequent fabrication stage of the processing method, the structure 10 includes a switching layer 32 that provides an electrolyte of the resistive memory element. The switching layer 32 includes a portion positioned on the interlayer dielectric layer 28 in an overlapping relationship and a portion positioned on the bottom electrode 30 also in an overlapping relationship. The heating electrode 22 is surrounded by the bottom electrode 30 with the tip 26 located proximate to the switching layer 32 and the tip 26 representing the closest portion of the heating electrode 22 to the switching layer 32. A portion of the bottom electrode 30 is positioned in a vertical direction between the heating electrode 22 and the switching layer 32 and, more specifically, a portion of the bottom electrode 30 has an intervening position in a vertical direction between the tip 26 of the heating electrode 22 and the switching layer 32.

In an embodiment, the switching layer 32 may be comprised of a metal oxide, such as magnesium oxide, tantalum oxide, hafnium oxide, titanium oxide, or aluminum oxide. In an embodiment, the switching layer 32 may be comprised of a dielectric material, such as silicon nitride or silicon dioxide. In an embodiment, the switching layer 32 may be comprised of a phase change material, such as germanium antimonide, germanium sulfide, or germanium-antimony-tellurium. The switching layer 32 may be formed by a deposition process and may have a nominally uniform thickness.

In an embodiment, the switching layer 32 includes a portion that directly contacts a top surface of the bottom electrode 30 and another portion that directly contacts a top surface of the interlayer dielectric layer 28. The switching layer 32 has a non-contacting relationship with the heating electrode 22 due to the intervening portion of the bottom electrode 30 that provides an intervening thickness of the material of the bottom electrode 30.

An interlayer dielectric layer 34 is formed over the switching layer 32. The interlayer dielectric layer 34 may be comprised of a dielectric material, such as silicon dioxide, deposited by chemical vapor deposition.

The structure 10 further includes a top electrode 36 that is positioned in the interlayer dielectric layer 34. The top electrode 36 is aligned in a vertical direction with the bottom electrode 30 and heating electrode 22 with an overlapping arrangement. The top electrode 36 may be comprised of a metal, such as tungsten, titanium nitride, tantalum nitride, or platinum. The top electrode 36 may be formed in the interlayer dielectric layer 34 by a damascene process. In an embodiment, the top electrode 36 may have a width W3 that is greater than the width W1 of the heating electrode 22. In an embodiment, the width W3 of the top electrode 36 may be equal or substantially equal to the width W2 of the bottom electrode 30. The formation of the bottom electrode 30 by a damascene process in an overlapping relationship with the heating electrode 22 provides the ability to precisely control the distance from the tip 26 of the heating electrode 22 to the top electrode 36.

In use, one or more filaments may be formed in the switching layer 32 as conductive paths that bridge from the bottom electrode 30 to the top electrode 36 through the application of a suitable programming voltage to provide the low-resistance state or to switch from the high-resistance state to the low-resistance state. The heating electrode 22 assists with filament formation. In particular, during programming, the heating electrode 22 generates a temperature gradient in the bottom electrode 30 with the highest temperature occurring over the tip 26 of the heating electrode 22. Metal ions diffuse from the bottom electrode 30 into the switching layer 32, when programming the low-resistance state, with the highest diffusion rate coinciding with the location of highest temperature in the bottom electrode 30. The temperature gradient enhances the localization of metal ion diffusion across the switching layer 32 such that, when superimposed upon the effect of the programming voltage, the filaments are likewise locally concentrated in the switching layer 32 between the tip 26 and the top electrode 36. In the latter regard, each filament in the switching layer 32 may be originate in proximity to the tip 26 of the heating electrode 22, and each filament may end over a switching area on the opposite side of the switching layer 32 that is significantly less than the total surface area of the top electrode 36 contacting the switching layer 32. The programming voltage needed for a reset disrupting the filaments and restoring the high-resistance state may not be effected by the temperature gradient in the bottom electrode 30.

The resistive memory element may consume less power during operation and exhibit fewer switching variations due to the narrowing of the switching area through the introduction of a temperature gradient that concentrates filament formation. For example, the current and/or switching time to set the low-resistance state may be reduced because less energy is wasted by the generation of filaments in the switching layer 32 that do not extend from the bottom electrode 30 to the top electrode 36 and that represent non-conductive paths that terminate inside the switching layer 32. As another example, the current and voltage (i.e., power) needed to reset the structure 10 to the high-resistance state may be reduced by the absence, or minimization, of non-conductive paths. The lifetime and reliability of the resistive memory element may be improved by a reduction of residual metal ions in the switching layer 32 following multiple set and reset cycles.

Figure 4:
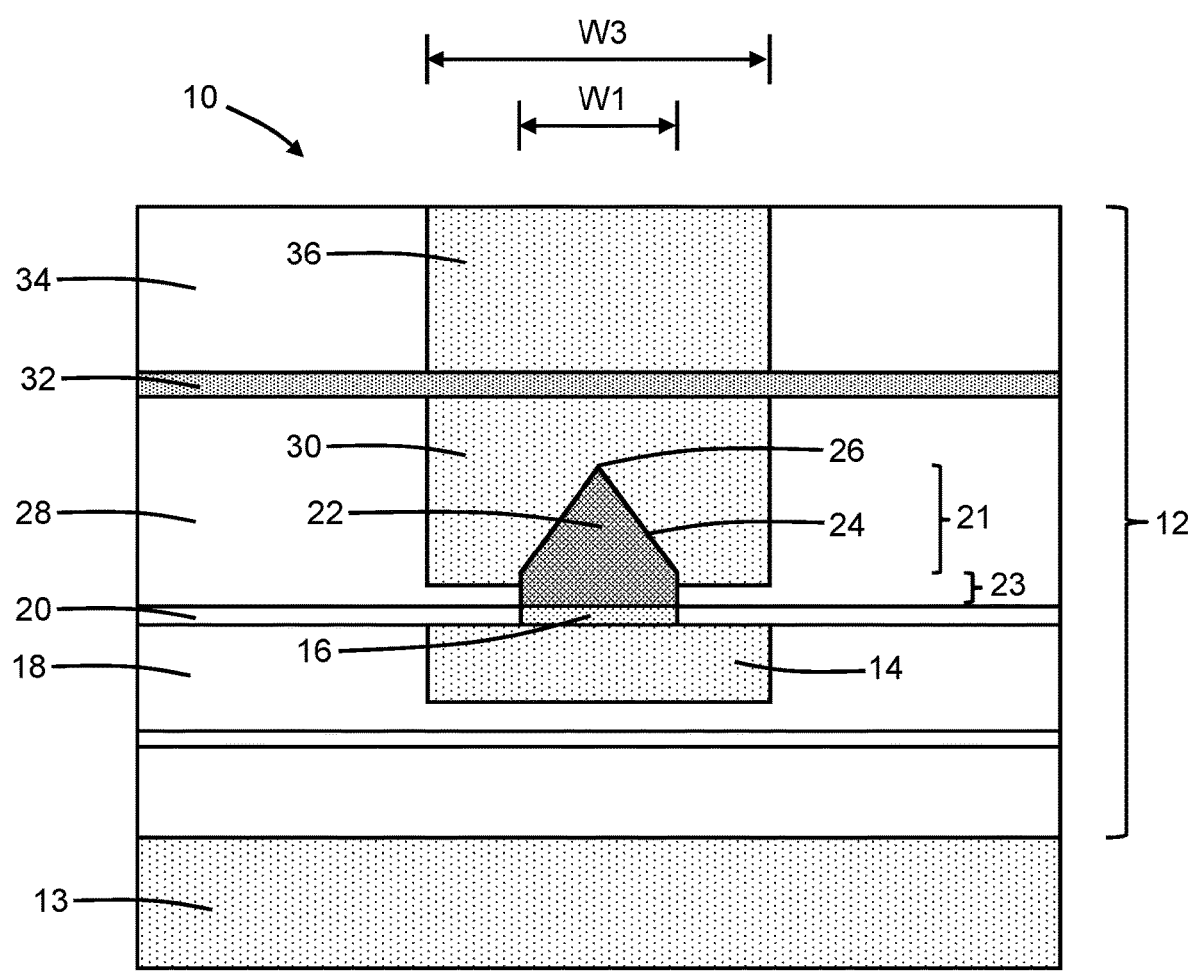
FIGS. 4-5 are diagrammatic cross-sectional views of structures for a resistive memory element in accordance with alternative embodiments of the invention.

With reference to FIG. 4 in which like reference numerals refer to like features in FIG. 3 and in accordance with alternative embodiments, the shape of the heating electrode 22 may be differ from the representative tapered-only shape. In an embodiment, the heating electrode 22 may include multiple shapes that are monolithic and stacked. Specifically, the sidewall 24 may be tapered over a portion 21 of the heating electrode 22 and may be non-tapered over a portion 23 of the heating electrode 22. The composite shape portions 21, 23 may be produced by adjusting the process parameters for the ion etching process used to shape the heating electrode 22.

Figure 5:
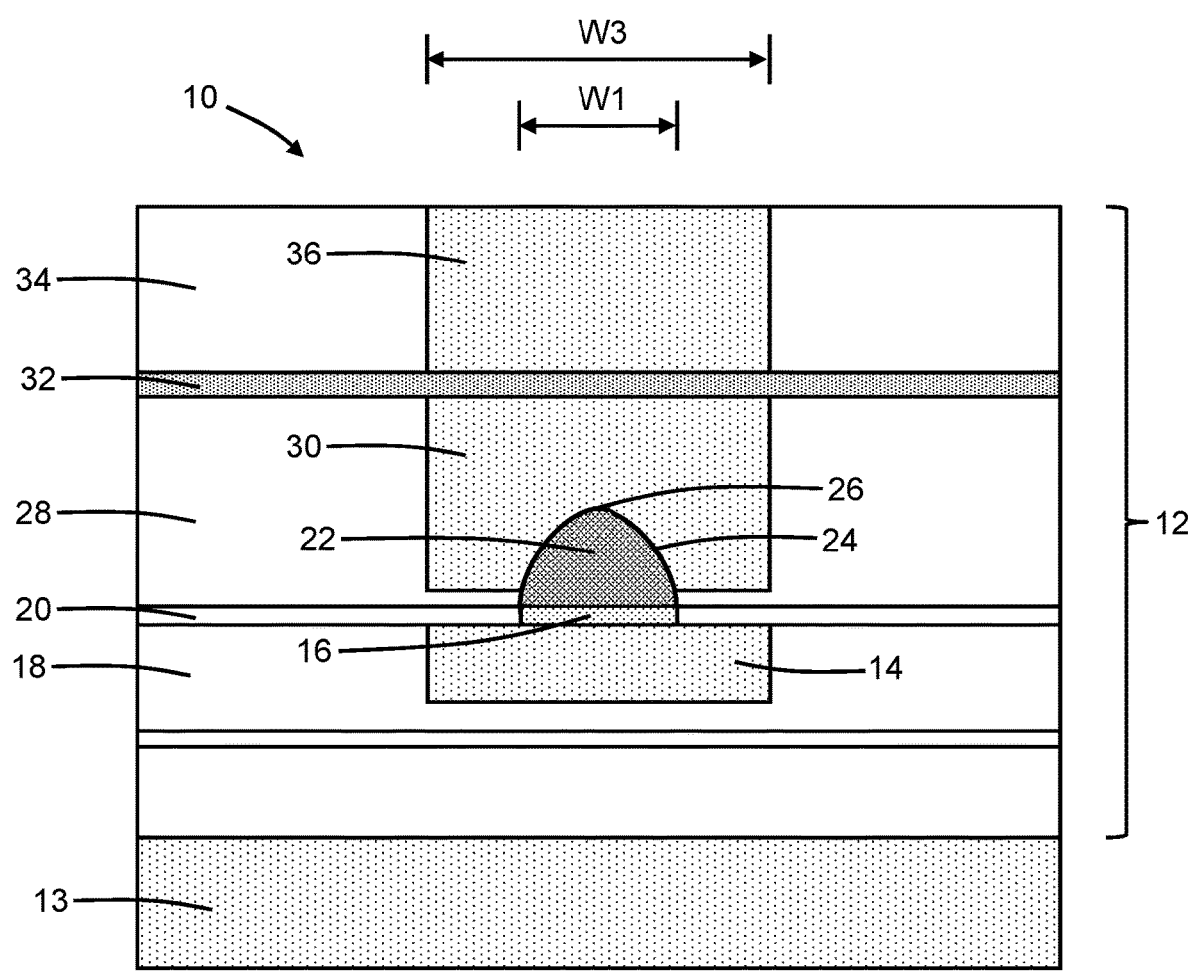

With reference to FIG. 5 in which like reference numerals refer to like features in FIG. 3 and in accordance with alternative embodiments, the sidewall 24 of the heating electrode 22 may have a curvature that extends over at least a portion of its height, and the tip 26 of the heating electrode 22 may be rounded instead of pointed. The modified shape with the curved sidewall 24 and rounded tip 26 may be produced by adjusting the process parameters for the ion etching process. In an embodiment, the curvature of the sidewall 24 may extend over the entire height of the heating electrode 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first dielectric layer;
a via extending through the first dielectric layer;
a second dielectric layer on the first dielectric layer; and
a resistive memory element including a first electrode, a second electrode partially embedded in the first electrode, a third electrode, and a switching layer positioned between the first electrode and the third electrode, the second electrode including a tip positioned in the first electrode adjacent to the switching layer and a sidewall that tapers to the tip, the second electrode positioned on the via, the second electrode having a first portion including the tip and a second portion, the first portion of the second electrode embedded in the first electrode, the second portion of the second electrode embedded in a portion of the second dielectric layer between the first dielectric layer and the first electrode, the first portion of the second electrode in direct contact with the first electrode, and the second portion of the second electrode in direct contact with the second dielectric layer.

2. The structure of claim 1 wherein the first electrode is comprised of a first material, and the second electrode is comprised of a second material that is different in composition from the first material.

3. The structure of claim 2 wherein the first material is copper or silver, and the second material is tantalum nitride or titanium nitride.

4. The structure of claim 2 wherein the first material is copper or silver, and the second material is silicon germanium.

5. The structure of claim 1 wherein the tip of the second electrode is separated from the switching layer by a portion of the first electrode.

6. The structure of claim 5 wherein the switching layer is positioned between the portion of the first electrode and the third electrode.

7. The structure of claim 1 wherein the tip of the second electrode is pointed.

8. The structure of claim 1 wherein the sidewall of the second electrode has a curvature, and the tip of the second electrode is rounded.

9. The structure of claim 8 wherein the curvature of the sidewall extends over an entire height of the second electrode.

10. The structure of claim 1 wherein the first portion of the second electrode is positioned between the second portion of the second electrode and the switching layer, and the second portion of the second electrode is non-tapered.

11. The structure of claim 1 wherein the first electrode has a first width dimension, the second electrode has a second width dimension, and the second width dimension is less than the first width dimension.

12. The structure of claim 11 wherein the third electrode has a third width dimension, and the second width dimension is less than the third width dimension.

13. The structure of claim 12 wherein the third width dimension and the first width dimension are substantially equal.

14. The structure of claim 1 wherein the switching layer has a non-contacting relationship with the second electrode.

15. The structure of claim 1 wherein the third electrode is aligned in a vertical direction with the first electrode and the second electrode.

16. A method of forming a structure for a resistive memory element, the method comprising:
forming a first dielectric layer;
forming a via extending through the first dielectric layer;
forming a second dielectric layer on the first dielectric layer;
forming a first electrode including a tip and a sidewall that tapers to the tip, wherein the first electrode is positioned on the via, and the first electrode has a first portion including the tip and a second portion;
forming a second electrode on the first electrode, wherein the first portion of the first electrode is embedded in the second electrode, the second portion of the first electrode is embedded in a portion of the second dielectric layer between the first dielectric layer and the second electrode, the first portion of the first electrode is in direct contact with the second electrode, and the second portion of the first electrode is in direct contact with the second dielectric layer;
forming a switching layer on the second electrode, wherein the first electrode is partially embedded in the second electrode with the tip of the first electrode adjacent to the switching layer; and
forming a third electrode on the switching layer, wherein the switching layer is positioned between the second electrode and the third electrode.

17. The method of claim 16 wherein the first electrode is comprised of a first material, and the second electrode is comprised of a second material different in composition from the first material.

18. The method of claim 17 wherein the first material is copper or silver, and the second material is tantalum nitride or titanium nitride.

19. The method of claim 17 wherein the first material is copper or silver, and the second material is silicon germanium.

20. The method of claim 16 wherein the tip of the first electrode is separated from the switching layer by a portion of the second electrode, and the switching layer is positioned between the portion of the second electrode and the third electrode.

* * * * *